(12) United States Patent
Bi

(10) Patent No.: US 10,283,569 B2
(45) Date of Patent: *May 7, 2019

(54) TANDEM ORGANIC LIGHT-EMITTING DIODE, ARRAY SUBSTRATE AND DISPLAY DEVICE

(71) Applicant: BOE TECHNOLOGY GROUP CO., LTD., Beijing (CN)

(72) Inventor: Wentao Bi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 191 days.

This patent is subject to a terminal disclaimer.

(21) Appl. No.: 15/322,590

(22) PCT Filed: Apr. 21, 2016

(86) PCT No.: PCT/CN2016/079884
§ 371 (c)(1),
(2) Date: Dec. 28, 2016

(87) PCT Pub. No.: WO2017/000634
PCT Pub. Date: Jan. 5, 2017

(65) Prior Publication Data
US 2017/0213875 A1    Jul. 27, 2017

(30) Foreign Application Priority Data
Jun. 29, 2015  (CN) .......................... 2015 1 0370289

(51) Int. Cl.
*H01L 27/32*        (2006.01)
*H01L 51/00*        (2006.01)
(Continued)

(52) U.S. Cl.
CPC ...... *H01L 27/3204* (2013.01); *H01L 51/4253* (2013.01); *H01L 51/5056* (2013.01);
(Continued)

(58) Field of Classification Search
CPC ....... H01L 2251/5384; H01L 2251/552; H01L 27/3204; H01L 51/0046; H01L 51/005;
(Continued)

(56) References Cited

U.S. PATENT DOCUMENTS 7,494,722 B2 *  2/2009  Liao .................... H01L 51/5278
                                                    257/E51.022
7,816,859 B2 * 10/2010  Spindler ................ C09K 11/06
                                                    313/504
(Continued)

FOREIGN PATENT DOCUMENTS

CN       101447555 A     6/2009
CN       101515633 A     8/2009
(Continued)

OTHER PUBLICATIONS

Machine translation for CN 104183778 A (publication date: Dec. 2014). (Year: 2014).*

(Continued)

*Primary Examiner* — Dawn L Garrett
(74) *Attorney, Agent, or Firm* — Dilworth & Barrese, LLP.; Michael J. Musella, Esq.

(57) ABSTRACT

A tandem organic light-emitting diode, an array substrate and a display device are provided. The tandem organic light-emitting diode includes an anode (10), a hole transport layer (11), a first light-emitting layer (12), a first charge generation layer (13), a second charge generation layer (14), a third charge generation layer (15), a second light-emitting layer (16), an electron transport layer (17) and a cathode (18) which are sequentially laminated, wherein the first charge generation layer (13) is an N-type bulk heterojunction, the second charge generation layer (14) is a PN junction type bulk heterojunction, and the third charge generation layer (15) is a P-type bulk heterojunction. The array substrate includes a plurality of the above tandem organic light-
(Continued)

emitting diodes and the display device includes the above array substrate. The tandem organic light-emitting diode provided herein can be applied in a display device for reducing power consumption.

11 Claims, 1 Drawing Sheet

(51) Int. Cl.
H01L 51/42 (2006.01)
H01L 51/50 (2006.01)
H01L 51/52 (2006.01)

(52) U.S. Cl.
CPC ...... *H01L 51/5072* (2013.01); *H01L 51/5278* (2013.01); *H01L 51/005* (2013.01); *H01L 51/0046* (2013.01); *H01L 51/0054* (2013.01); *H01L 51/0055* (2013.01); *H01L 51/0061* (2013.01); *H01L 51/0067* (2013.01); *H01L 51/0072* (2013.01); *H01L 51/0078* (2013.01); *H01L 51/0085* (2013.01); *H01L 2251/5384* (2013.01); *H01L 2251/552* (2013.01)

(58) Field of Classification Search
CPC ............. H01L 51/0054; H01L 51/0055; H01L 51/0061; H01L 51/0067; H01L 51/0072; H01L 51/0078; H01L 51/0085; H01L 51/4253; H01L 51/5056; H01L 51/5072; H01L 51/5278

See application file for complete search history.

(56) References Cited

U.S. PATENT DOCUMENTS

| | | | | |
|---|---|---|---|---|
| 8,476,624 B1* | 7/2013 | Wu | ...................... | H01L 51/5004 257/40 |
| 2006/0040132 A1* | 2/2006 | Liao | ..................... | H01L 51/5036 428/690 |
| 2006/0087225 A1* | 4/2006 | Liao | ..................... | H01L 51/5036 313/504 |
| 2006/0157728 A1* | 7/2006 | Iou | ........................ | B82Y 10/00 257/103 |
| 2006/0188745 A1* | 8/2006 | Liao | ..................... | H01L 51/5278 428/690 |
| 2009/0001885 A1* | 1/2009 | Spindler | ............. | H01L 51/0079 313/506 |
| 2009/0045728 A1* | 2/2009 | Murano | .............. | H01L 51/5052 313/504 |
| 2009/0304909 A1 | 12/2009 | Daniels | | |
| 2011/0248249 A1 | 10/2011 | Forrest et al. | | |
| 2013/0228753 A1* | 9/2013 | Moon | ................. | H01L 51/5004 257/40 |
| 2015/0034923 A1* | 2/2015 | Kim | .................... | H01L 51/5044 257/40 |
| 2015/0200378 A1* | 7/2015 | Reusch | ............... | H01L 51/5278 257/40 |
| 2016/0248033 A1* | 8/2016 | Uesaka | ................. | H01L 51/504 |
| 2017/0200770 A1 | 7/2017 | Bi | | |

FOREIGN PATENT DOCUMENTS

| | | | |
|---|---|---|---|
| CN | 102074658 A | | 5/2011 |
| CN | 103022366 A | * | 4/2013 |
| CN | 104183778 A | | 12/2014 |
| CN | 105161627 A | | 12/2015 |
| CN | 105161628 A | | 12/2015 |
| WO | WO 2014/023478 | * | 2/2014 |

OTHER PUBLICATIONS

Machine translation for CN 103022366 A (publication date: Apr. 2013). (Year: 2013).*
International Search Report dated Jul. 26, 2016.
First Chinese Office Action dated Apr. 20, 2016.
Second Chinese Office Action dated Jul. 4, 2015.
International Search Report dated Jul. 27, 2016.
Office Action and Written Opinion issued in U.S. Appl. No. 15/323,153 dated Oct. 4, 2018.
International Search Report and Written Opinion dated Jul. 27, 2016.
Office Action issued in U.S. Appl. No. 15/323,152 dated Oct. 4, 2018.
Notice of Allowance issued in U.S. Appl. No. 15/323,152 dated Jan. 18, 2019.

* cited by examiner

TANDEM ORGANIC LIGHT-EMITTING DIODE, ARRAY SUBSTRATE AND DISPLAY DEVICE

TECHNICAL FIELD

The present disclosure relates to a tandem organic light-emitting diode, an array substrate and a display device.

BACKGROUND

Currently, organic light-emitting diodes are extensively applied in display devices owing to their advantages such as low energy consumption, wide color gamut, wide viewing angle and fast response, etc. In particular, tandem organic light-emitting diodes have a low current density and can effectively avoid the thermal quenching effect caused by excess current. Therefore, tandem organic light-emitting diodes have become popular in display devices.

SUMMARY

In a first aspect, the present disclosure provides a tandem organic light-emitting diode, comprising an anode, a hole transport layer, a first light-emitting layer, a first charge generation layer, a second charge generation layer, a third charge generation layer, a second light-emitting layer, an electron transport layer and a cathode which are sequentially laminated, wherein the first charge generation layer is an N-type bulk heterojunction; the second charge generation layer is a PN junction type bulk heterojunction; and the third charge generation layer is a P-type bulk heterojunction.

In a second aspect, the present disclosure further provides an array substrate comprising a plurality of tandem organic light-emitting diodes as described above.

In a third aspect, the present disclosure further provides a display device comprising the array substrate as described above.

BRIEF DESCRIPTION OF THE DRAWINGS

In order to clearly illustrate the technical solutions of the embodiments of the present disclosure, the drawings of the embodiments are briefly described below. Apparently, the drawings described below relate to only some embodiments of the present disclosure and thus are not limitative of the present disclosure.

REFERENCE SIGNS

Figure 1:
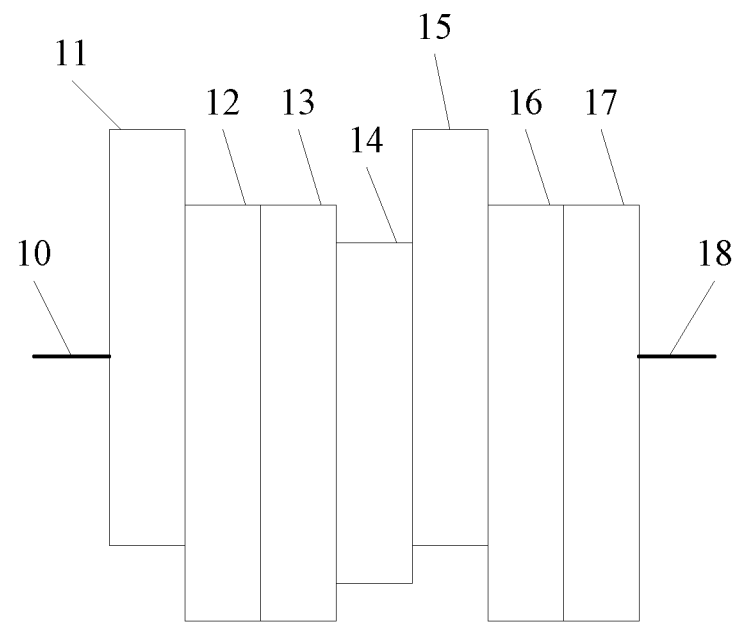
FIG. 1 is a schematic view of a tandem organic light-emitting diode according to an embodiment of the present disclosure.

10—anode, 11—hole transport layer, 12—first light-emitting layer, 13—first charge generation layer, 14—second charge generation layer, 15—third charge generation layer, 16—second light-emitting layer, 17—electron transport layer, 18—cathode, 19—exciton-forming interface.

DETAILED DESCRIPTION

To make clearer the objects, technical solutions and advantages of the embodiments of the present disclosure, a clear and full description of the technical solutions of the embodiments of the present disclosure will be made with reference to the accompanying drawings of the embodiments of the present disclosure. Apparently, the described embodiments are just part rather than all of the embodiments of the present disclosure. Based on the embodiments of the present disclosure described, all the other embodiments obtained by a person of ordinary skill in the art, without any creative labor, fall within the scope of protection of the present disclosure.

A tandem organic light-emitting diode comprises an anode, a first hole transport layer, a first light-emitting layer, a first electron transport layer, a charge generation layer, a second hole transport layer, a second light-emitting layer, a second electron transport layer and a cathode which are sequentially laminated. In this tandem organic light-emitting diode, some carriers are provided by a driving voltage and the other carriers are generated in the charge generation layer. However, the injection efficiency of the carriers needs to be improved to ensure the luminous efficiency of the tandem organic light-emitting diode, and thus a high driving voltage is required for normal luminescence of the tandem organic light-emitting diode, which would result in high energy consumption. The tandem organic light-emitting diode has a driving voltage of about 6 V and a power efficiency of about 5.3 lm/W.

One object of the present disclosure is to provide a tandem organic light-emitting diode, an array substrate and a display device for solving the problem of high energy consumption caused by a high driving voltage required for normal luminescence of tandem organic light-emitting diodes.

In a first aspect, the present disclosure provides a tandem organic light-emitting diode comprising an anode, a hole transport layer, a first light-emitting layer, a first charge generation layer, a second charge generation layer, a third charge generation layer, a second light-emitting layer, an electron transport layer and a cathode which are sequentially laminated, wherein the first charge generation layer is an N-type bulk heterojunction; the second charge generation layer is a PN junction type bulk heterojunction; and the third charge generation layer is a P-type bulk heterojunction.

In a second aspect, the present disclosure further provides an array substrate comprising a plurality of tandem organic light-emitting diodes as described above.

In a third aspect, the present disclosure further provides a display device comprising the array substrate as described above.

In the tandem organic light-emitting diode, the array substrate and the display device provided in the present disclosure, because in the tandem organic light-emitting diode the first charge generation layer is an N-type bulk heterojunction, the second charge generation layer is a PN junction type bulk heterojunction, and the third charge generation layer is a P-type bulk heterojunction, an exciton-forming interface is formed respectively between the first charge generation layer and the second charge generation layer, and between the second charge generation layer and the third charge generation layer. The above two exciton-forming interfaces are capable of generating excitons, and the number of excitons generated is increased in comparison with other tandem organic light-emitting diodes having one charge generation layer. Moreover, the carriers in the excitons do not bind to each other, and thus the number of carriers is increased, which enables a low driving voltage to ensure the injection efficiency of the carriers for normal luminescence of the tandem organic light-emitting diode, thereby reducing the power consumption for normal luminescence of the tandem organic light-emitting diode.

Figure 2:
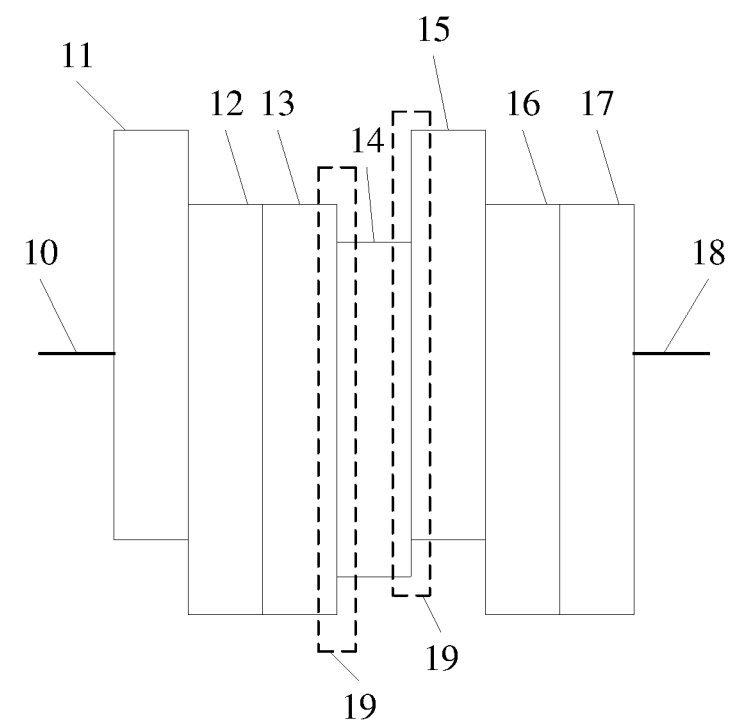
FIG. 2 is a schematic view of an exciton-forming interface in a tandem organic light-emitting diode according to an embodiment of the present disclosure.

Referring to FIG. 1, the tandem organic light-emitting diode provided in the embodiments of the present disclosure comprises an anode 10, a hole transport layer 11, a first light-emitting layer 12, a first charge generation layer 13, a second charge generation layer 14, a third charge generation layer 15, a second light-emitting layer 16, an electron transport layer 17, and a cathode 18 which are sequentially laminated, wherein the first charge generation layer 13 is an N-type bulk heterojunction, the second charge generation layer 14 is a PN junction type bulk heterojunction, and the third charge generation layer 15 is a P-type bulk heterojunction. As shown in FIG. 2, excitons are generated in the first charge generation layer 13, the second charge generation layer 14, and the third charge generation layer 15. An exciton-forming interface 19 is formed respectively between the first charge generation layer 13 and the second charge generation layer 14, and between the second charge generation layer 14 and the third charge generation layer 15. Excitons are also generated in the above two exciton-forming interfaces 19. It should be noted that the excitons generated in the first charge generation layer 13, the second charge generation layer 14, the third charge generation layer 15, and the above two exciton-forming interfaces 19 are composed of electrons and holes, but the electrons and the holes in the excitons are not bound, i.e., the excitons in the first charge generation layer 13, the second charge generation layer 14, the third charge generation layer 15, and the above two exciton-forming interfaces 19 provide carriers for the light-emitting layer.

In addition, as compared with other tandem organic light-emitting diodes, the tandem organic light-emitting diode in the embodiments of the present disclosure also omits an electron transport layer for the first light-emitting layer and a hole transport layer for the second light-emitting layer, thereby reducing the injection barrier of the carriers in the tandem organic light-emitting diode. Therefore, in some embodiments, there is no electron transport layer or hole transport layer between the first light-emitting layer and the second light-emitting layer.

In the tandem organic light-emitting diode provided in the embodiments of the present disclosure, an exciton-forming interface 19 is formed respectively between the first charge generation layer 13 and the second charge generation layer 14, and between the second charge generation layer 14 and the third charge generation layer 15 because the first charge generation layer 13 is an N-type bulk heterojunction, the second charge generation layer 14 is a PN junction type bulk heterojunction, and the third charge generation layer 15 is a P-type bulk heterojunction. The above two exciton-forming interfaces 19 are capable of generating excitons, and the number of excitons generated is increased in comparison with other tandem organic light-emitting diodes having one charge generation layer. Moreover, the carriers in the excitons do not bind to each other, and thus the number of carriers is increased, which enables a low driving voltage to ensure the injection efficiency of the carriers for normal luminescence of the tandem organic light-emitting diode, thereby reducing the power consumption for normal luminescence of the tandem organic light-emitting diode.

In order to further ensure that the two exciton-forming interfaces 19 in the above embodiments are capable of generating excitons, the first charge generation layer 13 comprises a mixture of a first organic material and a second organic material (for example, the first charge generation layer 13 is formed from a mixture of a first organic material and a second organic material), wherein a proportion of the first organic material in the first charge generation layer 13 is greater than a proportion of the second organic material in the first charge generation layer 13. The type of the first organic material and the type of the second organic material are not limited herein. The first organic material in the first charge generation layer 13 has an electron mobility of greater than $1 \times 10^{-7}$ cm$^2$/V·s, a highest occupied orbital energy level of less than −5.5 EV, and a lowest unoccupied orbital energy level of greater than −3.5 eV. The second charge generation layer 14 comprises a mixture of a second organic material and a third organic material (for example, the second charge generation layer 14 is formed from a mixture of a second organic material and a third organic material), wherein the second organic material is an N-type organic material, the third organic material is a P-type organic material, and proportions of the second organic material and the third organic material in the second charge generation layer 14 are not limited herein; the second organic material has an electron mobility of greater than $1 \times 10^{-7}$ cm$^2$/V·s, and the third organic material has a hole mobility of is greater than $1 \times 10^{-7}$ cm$^2$/V·s. The third charge generation layer 15 comprises a mixture of a third organic material and a fourth organic material (for example, the third charge generation layer 15 is formed from a mixture of a third organic material and a fourth organic material), wherein a proportion of the third organic material in the third charge generation layer 15 is less than a proportion of the fourth organic material in the third charge generation layer 15, and the type of the third organic material and the type of the fourth organic material in the third charge generation layer 15 are not limited herein; and the fourth organic material has a hole mobility of greater than $1 \times 10^{-7}$ cm$^2$/V·s, a highest occupied orbital energy level of less than −5.0 eV, and a lowest unoccupied orbital energy level of greater than −3.0 eV. In addition, the first light-emitting layer 12 and the second light-emitting layer 16 each independently comprise a mixture of at least one host organic material and at least one guest organic material (for example, they are formed from a mixture of at least one host organic material and at least one guest organic material).

The specific organic materials constituting the first charge generation layer 13, the second charge generation layer 14, and the third charge generation layer 15 will be described below with specific examples. For example, the first charge generation layer 13 is formed by mixing a first organic material with a second organic material, wherein the first organic material may be TmPyPb (i.e., 1,3,5-tris[(3-pyridyl)3-phenyl]benzene) and the second organic material may be C$_{60}$; the second charge generation layer 14 is formed by mixing the second organic material with a third organic material, wherein the third organic material may be rubrene, pentacene, tetrafluorotetracyanoquinonedimethane, CuPc (i.e., copper phthalocyanine) or another phthalocyanine derivative; the third charge generation layer 15 is formed by mixing the third organic material with a fourth organic material, wherein the fourth organic material is TCTA (i.e., 4,4',4''-tri(carbazol-9-yl) triphenylamine).

Alternatively, in the first charge generation layer 13, the first organic material can be Bphen (i.e., 4,7-diphenyl-1,10-phenanthroline) and the second organic material can be C$_{60}$; the third organic material in the second charge generation layer 14 can be rubrene, pentacene, tetrafluorotetracyanoquinodimethane, CuPc or another phthalocyanine derivative; and the fourth organic material in the third charge generation layer 15 can be NPB (i.e., N,N'-di(1-naphthyl)-N,N'-diphenyl-1,1'-biphenyl-4,4'-diamine.

For a more detailed description of the particular composition of the tandem organic light-emitting diode in the embodiments of the present disclosure, specific organic materials of the first charge generation layer 13, the second charge generation layer 14, and the third charge generation layer 15, as well as the specific organic materials constituting other layers of the tandem organic light-emitting diode will be exemplified below.

EMBODIMENTS

Embodiment 1

Taking a tandem organic light-emitting diode which emitted blue light as an example, the anode 10 of the tandem organic light-emitting diode was a bottom emitting glass substrate with indium tin oxide and had a thickness of 100 nm; the hole transport layer 11 was a TCTA layer and had a thickness of 90 nm; in the first light-emitting layer 12, the host organic material comprised TCTA and TmPyPb, wherein TCTA had a hole mobility of $1\times10^{-3}$ $cm^2/V \cdot s$, a highest occupied orbital energy level of −5.7 eV, a lowest unoccupied orbital energy level of −2.6 eV, and a triplet energy level of 2.76 eV, and TmPyPb had an electron mobility of $2.4\times10^{-4}$ $cm^2/V \cdot s$, a highest occupied orbital energy level of −6.7 eV, a lowest unoccupied orbital energy level of −2.6 eV, and a triplet energy level of 2.78 eV; and the guest organic material was FIrpic (i.e., bis[2-(4,6-difluorophenyl)pyridinato-$C^2$,N](picolinato)iridium(III)) having a triplet energy level of 2.62 eV. The triplet energy levels of the two host organic materials were both greater than that of the guest organic material, such that energy transfer could be better achieved between the host and guest organic materials of the light-emitting layer. The first light-emitting layer 12 had a thickness of 20 nm; the first charge generation layer 13 was formed by mixing TmPyPb with $C_{60}$ and had a thickness of 50 nm, wherein $C_{60}$ had an electron mobility of 0.1 $cm^2/V \cdot s$, a highest occupied orbital energy level of −6.2 eV, and a lowest unoccupied orbital energy level of −4.6 eV; the second charge generation layer 14 was formed by mixing $C_{60}$ with CuPc and had a thickness of 20 nm, wherein CuPc had a hole mobility of $1.96\times10^{-2}$ $cm^2/V \cdot s$, a highest occupied orbital energy level of −5.3 eV, and a lowest unoccupied orbital energy level of −3.6 eV; the third charge generation layer 15 was formed by mixing TCTA with CuPc and had a thickness of 50 nm; the second light-emitting layer 16 had the same specific materials as the first light-emitting layer 12, and had a thickness of 20 nm; the electron transport layer 17 was a TmPyPb layer and had a thickness of 30 nm; and the cathode 18 was a magnesium-silver alloy layer and had a thickness of 120 nm.

Embodiment 2

Still taking a tandem organic light-emitting diode which emitted blue light as an example, the anode 10 was the same as the anode 10 of the tandem organic light-emitting diode which emitted blue light in Embodiment 1; the hole transport layer 11 was an NPB layer; in the first light-emitting layer 12, the host organic material comprised NPB and Bphen, wherein NPB had a hole mobility of $5.1\times10^{-4}$ $cm^2/V \cdot s$, a highest occupied orbital energy level of −5.4 eV and a lowest unoccupied orbital energy level of −2.4 eV, and Bphen had an electron mobility of $4.2\times10^{-4}$ $cm^2/V \cdot s$, a highest occupied orbital energy level of −6.1 eV and a lowest unoccupied orbital energy level of −2.8 eV; and the guest organic material was FIrpic; the first charge generation layer 13 was formed by mixing Bphen with $C_{60}$; the second charge generation layer 14 was formed by mixing $C_{60}$ with CuPc; the third charge generation layer 15 was formed by mixing NPB with CuPc; the second light-emitting layer 16 had the same specific materials as the first light-emitting layer 12; and the electron transport layer 17 was a Bphen layer.

The above tandem organic light-emitting diode which emitted blue light in Embodiments 1 and 2 had a luminous main peak located at 472 nm and a shoulder peak located at 496 nm. The tandem organic light-emitting diodes in Embodiments 1 and 2 had a driving voltage of 5.8 V and 5.6 V and a power efficiency of 5.8 lm/W and 6.2 lm/W, respectively.

The production process of the above tandem organic light-emitting diode which emitted blue light will be described below. Firstly, a bottom emitting glass substrate (i.e., anode 10) with indium tin oxide was cleansed in an ultrasonic environment of deionized water, acetone, and anhydrous ethanol sequentially followed by drying the bottom emitting glass substrate with indium tin oxide using $N_2$, plasma cleansing to remove oxides, placing the bottom emitting glass substrate with indium tin oxide in a vapor deposition chamber with a vacuum degree of less than $5\times10^{-4}$ Pa, and subjecting the bottom emitting glass substrate with indium tin oxide to vacuum vapor deposition to deposit a hole transport layer 11, a first light-emitting layer 12, a first charge generation layer 13, a second charge generation layer 14, a third charge generation layer 15, a second light-emitting layer 16, an electron transport layer 17, and a cathode 18 sequentially on the bottom emitting glass substrate with indium tin oxide. A metal cathode mask was used in the vapor deposition process of the cathode 18 at an evaporation rate of 0.3 nm/s; and an open mask was used in the vapor deposition process of the other layers at an evaporation rate of 0.1 nm/s.

It should be noted that the above embodiments merely describe the specific materials of the tandem organic light-emitting diode which emits blue light, but replacement or variation of the specific materials of the tandem organic light-emitting diode which emits other color lights is also encompassed within the scope of protection of the present disclosure.

Embodiments of the present disclosure further provide an array substrate comprising a plurality of tandem organic light-emitting diodes according to the above embodiments. The tandem organic light-emitting diodes in the array substrate have the same advantages as the tandem organic light-emitting diodes in the above embodiments, and thus no further detail will be provided here.

Embodiments of the present disclosure further provide a display device comprising an array substrate according to the above embodiments. The array substrate in the display device has the same advantages as the array substrate in the above embodiments, and thus no further detail will be provided here.

In the description of the above embodiments, particular features, structures, materials, or characteristics may be combined in any one or more embodiments or examples in a suitable manner.

The above are merely exemplary embodiments of the present disclosure, and are not intended to limit the scope of protection of the present disclosure, which is yet determined by the appended claims.

The present application claims the priority of the Chinese patent application No. 201510370289.0 submitted on Jun. 29, 2015, and the content disclosed in the above Chinese patent application is incorporated herein by reference as part of the present application.

The invention claimed is:
1. A tandem organic light-emitting diode comprising an anode, a hole transport layer, a first light-emitting layer, a first charge generation layer, a second charge generation layer, a third charge generation layer, a second light-emitting layer, an electron transport layer, and a cathode which are sequentially laminated,
  wherein the first charge generation layer is an N-type bulk heterojunction, the second charge generation layer is a PN junction type bulk heterojunction, and the third charge generation layer is a P-type bulk heterojunction;
  the first charge generation layer comprises a mixture of a first organic material and a second organic material, wherein a proportion of the first organic material in the first charge generation layer is greater than a proportion of the second organic material in the first charge generation layer, and the first organic material has an electron mobility of greater than $1 \times 10^{-7}$ cm$^2$/V·s, a highest occupied orbital energy level of less than −5.5 eV and a lowest unoccupied orbital energy level of greater than −3.5 eV;
  the second charge generation layer comprises a mixture of the second organic material and a third organic material, wherein the second organic material is an N-type organic material; the third organic material is a P-type organic material; and the second organic material has an electron mobility of greater than $1 \times 10^{-7}$ cm$^2$/V·s and the third organic material has a hole mobility of greater than $1 \times 10^{-7}$ cm$^2$/V·s;
  the third charge generation layer comprises a mixture of the third organic material and a fourth organic material; a proportion of the third organic material in the third charge generation layer is less than a proportion of the fourth organic material in the third charge generation layer; and the forth organic material has a hole mobility of greater than $1 \times 10^{-7}$ cm$^2$/V·s, a highest occupied orbital energy level of less than −5.0 eV and a lowest unoccupied orbital energy level of greater than −3.0 eV.

2. The tandem organic light-emitting diode according to claim 1, wherein the first organic material comprises 1,3,5-tris[(3-pyridyl)-3-phenyl]benzene; the second organic material comprises C$_{60}$; the third organic material comprises at least one selected from the group consisting of rubrene, pentacene, tetrafluorotetracyanoquinodimethane, copper phthalocyanine or other phthalocyanine derivatives; and the fourth organic material comprises 4,4',4"-tri(carbazol-9-yl) triphenylamine.

3. The tandem organic light-emitting diode according to claim 1, wherein the first organic material comprises 4,7-diphenyl-1,10-phenanthroline; the second organic material comprises C$_{60}$; the third organic material comprises at least one selected from the group consisting of rubrene, pentacene, tetrafluorotetracyanoquinodimethane, copper phthalocyanine or other phthalocyanine derivatives; and the fourth organic material comprises N,N'-di(1-naphthyl)-N,N'-diphenyl-1,1'-biphenyl-4,4'-diamine.

4. The tandem organic light-emitting diode according to claim 1, wherein the first light-emitting layer and the second light-emitting layer each independently comprise a mixture comprising at least one host organic material and at least one guest organic material.

5. The tandem organic light-emitting diode according to claim 4, wherein the guest organic material comprises bis[2-(4,6-difluorophenyl)pyridinato-C$^2$,N](picolinato)iridium(III), the host organic material comprises 4,4',4"-tri(carbazol-9-yl)triphenylamine and 1,3,5-tris[(3-pyridyl)-3-phenyl]benzene, or the host organic material comprises N,N'-di(1-naphthyl)-N,N'-diphenyl-1,1'-biphenyl-4,4'-diamine and 4,7-diphenyl-1,10-phenanthroline.

6. An array substrate, comprising a plurality of tandem organic light-emitting diodes according to claim 1.

7. A display device, comprising the array substrate according to claim 6.

8. The array substrate according to claim 6, wherein the first organic material comprises 1,3,5-tris[(3-pyridyl)-3-phenyl]benzene; the second organic material comprises C$_{60}$; the third organic material comprises at least one selected from the group consisting of rubrene, pentacene, tetrafluorotetracyanoquinodimethane, copper phthalocyanine or other phthalocyanine derivatives; and the fourth organic material comprises 4,4',4"-tri(carbazol-9-yl) triphenylamine.

9. The array substrate according to claim 6, wherein the first organic material comprises 4,7-diphenyl-1,10-phenanthroline; the second organic material comprises C$_{60}$; the third organic material comprises at least one selected from the group consisting of rubrene, pentacene, tetrafluorotetracyanoquinodimethane, copper phthalocyanine or other phthalocyanine derivatives; and the fourth organic material comprises N,N'-di(l-naphthyl)-N,N'-diphenyl-1,1'-biphenyl-4,4'-diamine.

10. The array substrate according to claim 6, wherein the first light-emitting layer and the second light-emitting layer each independently comprise a mixture comprising at least one host organic material and at least one guest organic material.

11. The array substrate according to claim 10, wherein the guest organic material comprises bis[2-(4,6-difluorophenyl)pyridinato-C$^2$,N](picolinato)iridium(III), the host organic material comprises 4,4',4"-tri(carbazol-9-yl)triphenylamine and 1,3,5-tris[(3-pyridyl)-3-phenyl]benzene, or the host organic material comprises N,N'-di(1-naphthyl)-N,N'-diphenyl-1,1'-biphenyl-4,4'-diamine and 4,7-diphenyl-1,10-phenanthroline.

* * * * *